United States Patent
Ngai et al.

(10) Patent No.: US 11,770,107 B2
(45) Date of Patent: Sep. 26, 2023

(54) LOAD-ADAPTIVE POWER AMPLIFIER

(71) Applicant: QUALCOMM Incorporated, San Diego, CA (US)

(72) Inventors: Wai Lim Ngai, Poway, CA (US); Jeremy Darren Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 334 days.

(21) Appl. No.: 17/152,641

(22) Filed: Jan. 19, 2021

(65) Prior Publication Data

US 2022/0231641 A1  Jul. 21, 2022

(51) Int. Cl.
*H03F 3/21* (2006.01)

(52) U.S. Cl.
CPC ........ *H03F 3/211* (2013.01); *H03F 2200/294* (2013.01); *H03F 2200/451* (2013.01)

(58) Field of Classification Search
CPC ...................................................... H03F 3/211
See application file for complete search history.

(56) References Cited

U.S. PATENT DOCUMENTS

| | | | |
|---|---|---|---|
| 6,054,894 A * | 4/2000 | Wright ................. | H03F 1/3247 330/149 |
| 6,288,606 B1 * | 9/2001 | Ekman ................. | H03F 1/3241 330/149 |
| 7,894,546 B2 | 2/2011 | Magoon et al. | |
| 7,952,431 B2 | 5/2011 | Quack et al. | |
| 11,036,262 B1 * | 6/2021 | Ichitsubo ............. | H03G 3/3042 |
| 11,515,617 B1 * | 11/2022 | Ichitsubo ............. | H01Q 1/526 |
| 2006/0152279 A1 * | 7/2006 | Kijima ................. | H03F 1/0288 330/124 R |
| 2011/0169590 A1 * | 7/2011 | Namerikawa ......... | H03F 1/0288 333/136 |
| 2012/0013405 A1 * | 1/2012 | Eken ...................... | G01R 21/01 330/124 R |
| 2017/0146591 A1 | 5/2017 | Nobbe et al. | |
| 2018/0164366 A1 * | 6/2018 | Nobbe .................. | H03F 1/0277 |
| 2020/0169332 A1 * | 5/2020 | Tervo .................... | H04B 17/12 |

FOREIGN PATENT DOCUMENTS

WO    2009092722 A1    7/2009

OTHER PUBLICATIONS

Zheng S., et al., "A CMOS WCDMA/WLAN Digital Polar Transmitter With AM Replica Feedback Linearization", IEEE Journal of Solid-state Circuits, Jul. 2013, vol. 48, No. 7, pp. 1701-1709.
Zheng S., et al., "A WCDMA/WLAN Digital Polar Transmitter With Low-Noise ADPLL, Wideband PM/AM Modulator, and Linearized PA", IEEE Journal of Solid-state Circuits, Jul. 2015, vol. 50, No. 7, pp. 1645-1656.

* cited by examiner

*Primary Examiner* — Patricia T Nguyen
(74) *Attorney, Agent, or Firm* — Patterson + Sheridan LLP (57) ABSTRACT

Certain aspects of the present disclosure provide an amplification system. The amplification system generally includes: a first amplifier having an output coupled to an output of the amplification system; a second amplifier, inputs of the first amplifier and the second amplifier being coupled to an input of the amplification system; an impedance coupled to an output of the second amplifier; and a biasing circuit having a first voltage sense input coupled to the output of the first amplifier, a second voltage sense input coupled to the output of the second amplifier, and an output coupled to a bias input of the first amplifier.

32 Claims, 8 Drawing Sheets

LOAD-ADAPTIVE POWER AMPLIFIER

BACKGROUND

Field of the Disclosure

Certain aspects of the present disclosure generally relate to electronic components and, more particularly, to circuitry for signal amplification.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. The wireless communication capabilities of wireless devices depend on circuitry for signal amplification. For example, a transmit signal may be amplified using a power amplifier (PA) prior to being provided to an antenna for transmission. Similarly, a received signal may be amplified using a low-noise amplifier (LNA) prior to signal processing.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide an amplification system. The amplification system generally includes: a first amplifier having an output coupled to an output of the amplification system; a second amplifier, inputs of the first amplifier and the second amplifier being coupled to an input of the amplification system; an impedance coupled to an output of the second amplifier; and a biasing circuit having a first voltage sense input coupled to the output of the first amplifier, a second voltage sense input coupled to the output of the second amplifier, and an output coupled to a bias input of the first amplifier.

Certain aspects of the present disclosure provide a method for wireless communication. The method generally includes: determining a difference between output voltage swings of a first amplifier and a second amplifier, wherein the first amplifier comprises an output coupled to an output node and wherein the second amplifier comprises an output coupled to an impedance, inputs of the first amplifier and the second amplifier being coupled to an input node; and biasing the first amplifier based on the difference between the output voltage swings.

Certain aspects of the present disclosure provide an apparatus for wireless communication. The apparatus generally includes: means for determining a difference between output voltage swings of a first amplifier and a second amplifier, wherein the first amplifier comprises an output coupled to an output node and wherein the second amplifier comprises an output coupled to an impedance, inputs of the first amplifier and the second amplifier being coupled to an input node; and means for biasing the first amplifier based on the difference between the output voltage swings.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for signal amplification. For example, certain aspects provide a power amplifier (PA) that is a replica of a main PA of a transmit path. The replica PA may have an output coupled to an internal load such that the replica PA has a more linear gain profile as compared to the main PA. A load adaptive bias (LAB) circuit may monitor the output voltage swings of the main PA and the replica PA and bias the main PA accordingly. The LAB circuit may bias the main PA in an attempt to set the gain of the main PA according to a gain profile of the replica PA. In this manner, the linearity of the main PA may be increased, improving PA efficiency (PAE), error vector magnitude (EVM) and adjacent channel leakage ratio (ACLR).

Example Wireless Communications

Figure 1:
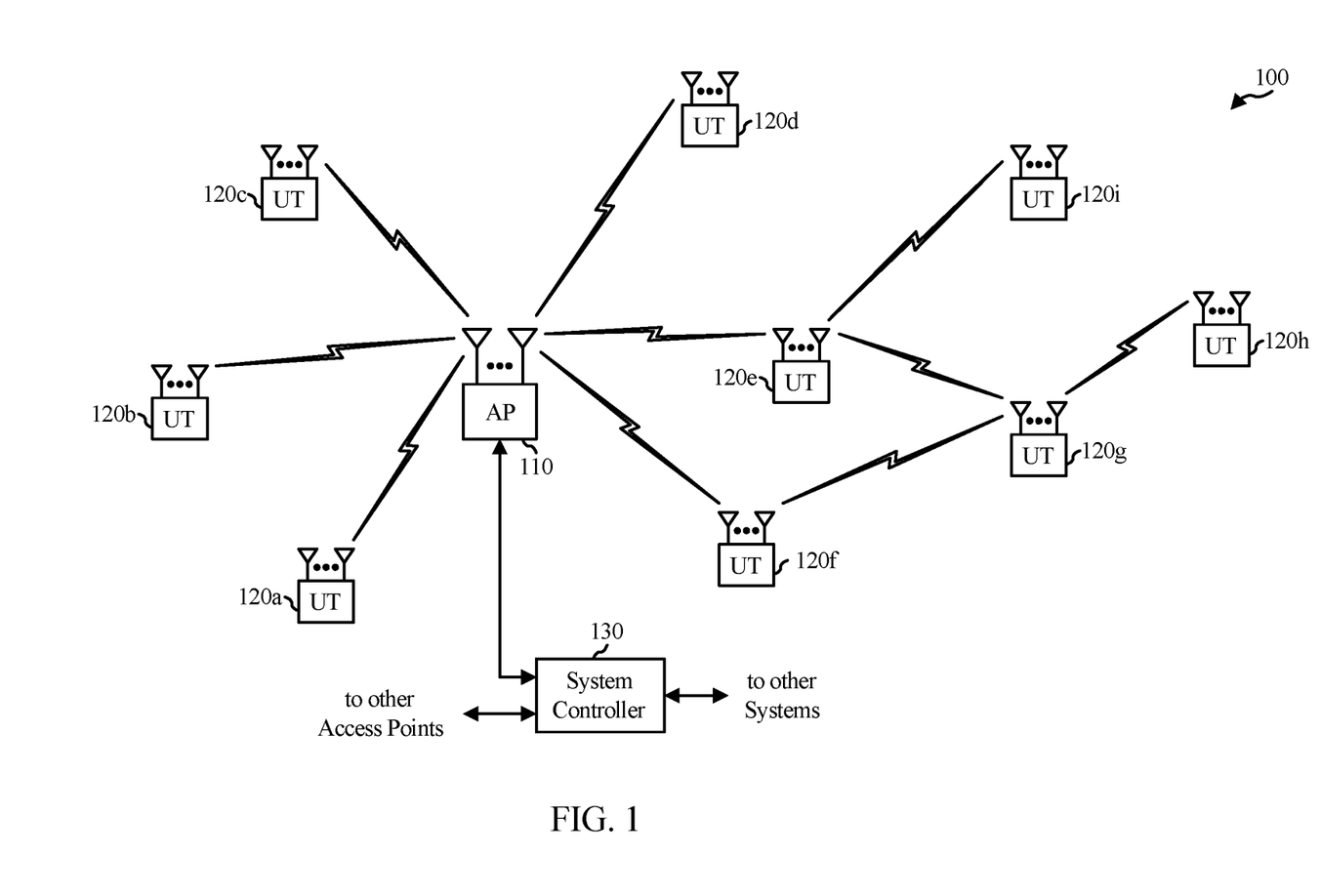
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), next generation Node B (gNB) or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include an amplification system implemented using a main power amplifier (PA) and a replica PA, as described in more detail herein.

Figure 2:
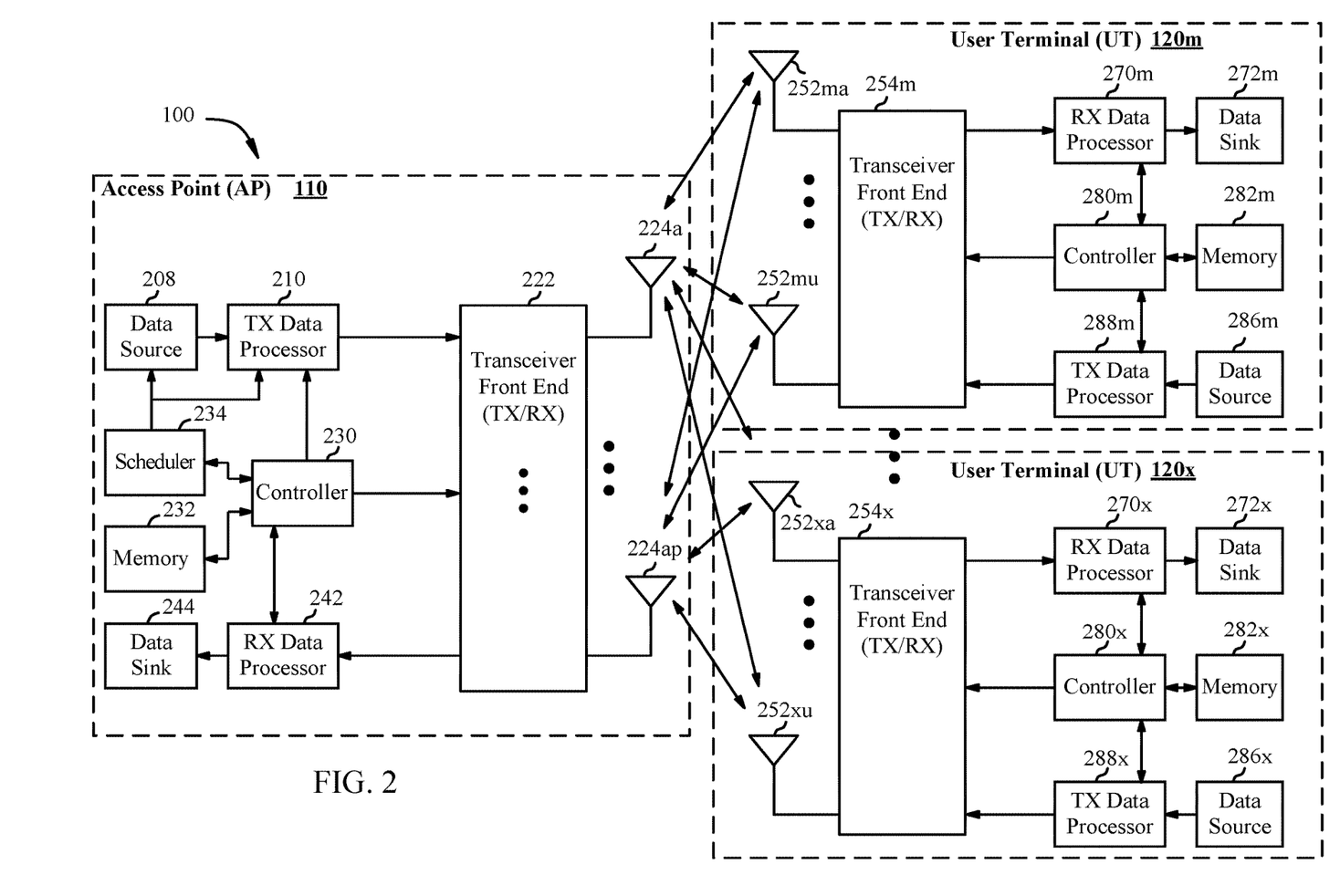
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas.

The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include an amplification system implemented using a main power amplifier (PA) and a replica PA, as described in more detail herein.

Figure 3:
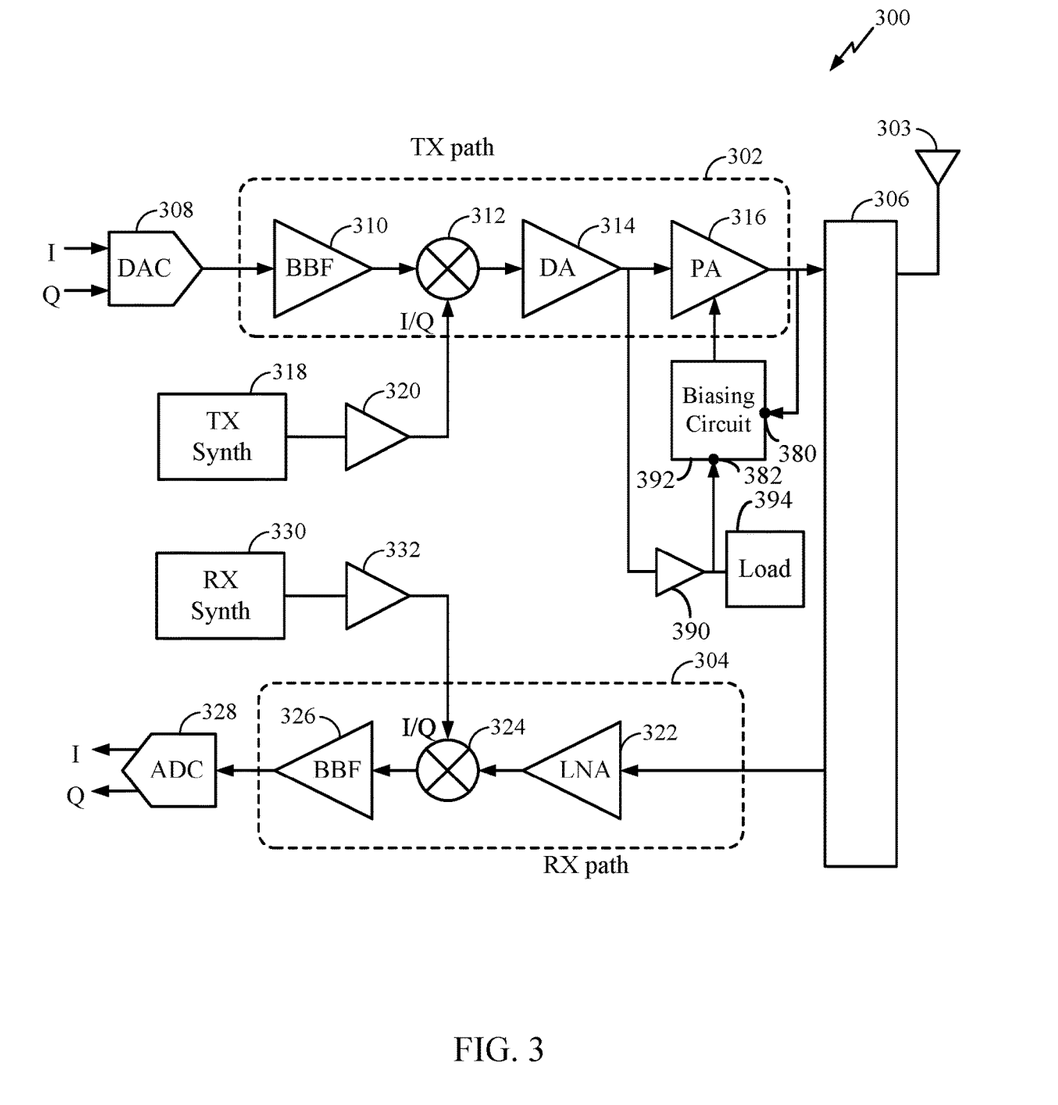
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306. TX path 302 and RX path 304 may be connected to an array of antennas to implement beam steering or beamforming in which case a portion of TX path 302 and RX path 304 will be replicated for each antenna element in the antenna array. The array of antennas to implement beam steering or beamforming may be called a phased array.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The PA 316 may be an array of multiple PAs when TX path 302 is connected to an array of antennas to implemented beam steering or beamforming. There may be a corresponding DA 314 for each PA 316 in the array of PAs.

In some aspects, the transceiver front end 300 may include a replica PA 390 and a biasing circuit 392. The PA 390 may be a replica of the PA 316. The inputs of the PA 316 and PA 390 may be coupled to a common input node (e.g., at output of DA 314). The output of the PA 390 may be coupled to a load 394. The biasing circuit 392 may bias the PA 316 based on the difference between output voltage swings of the PAs 316, 390, as described in more detail herein. The biasing circuit 392 may sense the output voltages at voltage sense inputs 380, 382, as illustrated. When PA 316 is an array of PAs for a phased array application, replica PA 390 may be replicated for each PA in the array or may be shared between multiple PAs 316 in the array.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it may be desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Techniques for Signal Amplification

As described above, a power amplifier (PA) may be the final active stage of a transmit path to drive an antenna. The performance (e.g., saturated power, efficiency, and linearity) of the PA may be sensitive to antenna impedance (e.g., load) variations. Such load variations may be characterized by the voltage standing wave ratio (VSWR) and may be caused by the antenna being covered by an object (e.g., hand/head) or placing the antenna close to conductive surfaces. In fifth generation (5G) millimeter wave (mmWave) technologies, beamforming is created by an antenna array. As the direction of a beam changes, the VSWR of each individual antenna varies significantly resulting from active-load-pulling.

A carefully designed linear PA maintains a high maximum linear power (MLP) by balancing linearity and efficiency. To a certain extent, such a PA may be biased in a way that maintains a linear behavior over a wide input power (Pin) range, assuming a nominal load (e.g., 50Ω). However, a PA may be sensitive to load variations, resulting in variations in the PA's load-line and disrupting the designed linearity and efficiency balance. In a particular case, if a load impedance ($Z_L$) presented to the PA is higher, the PA may have a higher voltage gain, which may result in voltage clipping at a relatively lower input power, resulting in linearity degradation. On the other hand, if $Z_L$ presented to the PA is lower, the PA may have a lower voltage gain, resulting in less voltage clipping and creating excessive gain-expansion that may also degrade linearity. Degraded linearity adversely impacts adjacent channel leakage ratio (ACLR), which generally refers to the ratio of a transmitted power on an assigned channel to power received in an adjacent radio channel. Degraded linearity can also adversely impact error vector magnitude (EVM), which is a measure of the difference between the actual transmitted signal and the ideal transmitted signal. Degraded power amplifier linearity is one source of increased EVM.

In some implementations, a balanced PA (e.g., quadrature PA) may be used to address VSWR variations. The balanced PA may include two signal paths. Input power may be first split equally at the input by a quadrature hybrid and then amplified separately by two amplifiers. The outputs of the amplifier may be then combined by another quadrature hybrid. The output quadrature hybrid effectively rotates the load presented to each PA by +/−90 degrees so the combined load variation seen by both PAs will be reduced. However, the issue with such a system is that this system uses two separate PAs where each has a separate electromagnetic (EM) structure, as well as two extra quadrature hybrids, resulting in high area consumption. This may be especially important for 5G beamforming integrated circuits (ICs) because such area will be multiplied by the number of antenna elements in the phased array antenna.

In PA design, extra margin may be designed in to allow for load variation which results in power back-off from output 1 dB compression power in nominal operating conditions and hence degrades the PA efficiency. A side effect of overdesigning the PA is that a transmit (Tx)/receive (Rx) switch and a low-noise amplifier (LNA) of the radio frequency (RF) front-end are also negatively impacted.

Certain aspects of the present disclosure provide a main PA and a replica PA, which may be used to determine a bias voltage for the main PA. The replica PA may be a replica of the main PA, but smaller (e.g., 1/96 the size of the main PA) than the main PA to reduce current consumption associated with the replica PA to a negligible level. A predefined internal load may be connected to the output of the replica PA. The output of the replica PA may be used as a reference for determining whether to adjust a bias voltage of the main PA, as described in more detail herein.

Figure 4:
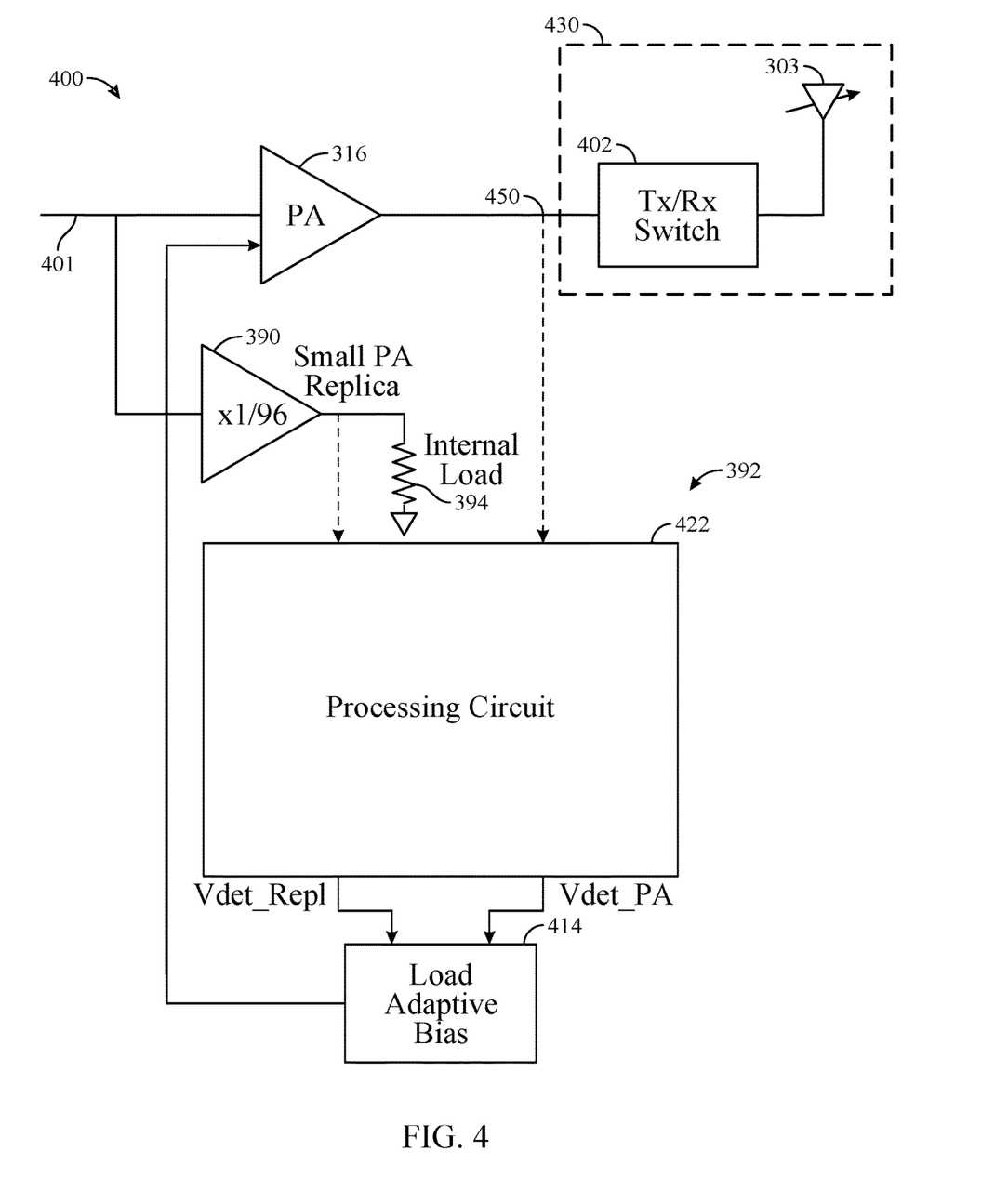
FIG. 4 illustrates an amplification system, in accordance with certain aspects of the present disclosure.

FIG. 4 illustrates an amplification system 400, in accordance with certain aspects of the present disclosure. As illustrated, the amplification system 400 includes a PA 316 (also referred to as a "main PA") having an input coupled to an input node 401 and having an output coupled to a load 430 (e.g., at output node 450). The load 430 may include a Tx/Rx switch 402 coupled between the output of the PA 316 and an antenna 303. In some implementations, the load 430 may include a duplexer in place of Tx/RX switch 402 shown in FIG. 4. In certain aspects, a replica PA 390 may be implemented with an input coupled to the input node 401, and an output coupled to an internal load 394 (e.g., a resistive element). The impedance (e.g., resistance) of the internal load 394 may be set to a nominal load impedance value.

As illustrated, the amplification system 400 may include a load adaptive bias (LAB) circuit 414, which may receive an indication of voltages at the outputs of the PA 316 and replica PA 390. For example, the voltages at the outputs of the PA 316 and replica PA 390 may be provided to a processing circuit 422. The processing circuit 422 may perform voltage division, envelope or peak detection, and filter operations, and provide a processed version of the voltages at the outputs of the PA 316 and replica PA 390 to the LAB circuit 414, as described in more detail herein. The LAB circuit 414 may detect a difference between the envelope or peak of voltage swings at the outputs of the PA 316 and replica PA 390, and adjust the bias voltage associated with the PA 316 to reduce variation in the gain compression characteristic of PA 316 as VSWR varies, as described in more detail herein.

Figure 5:
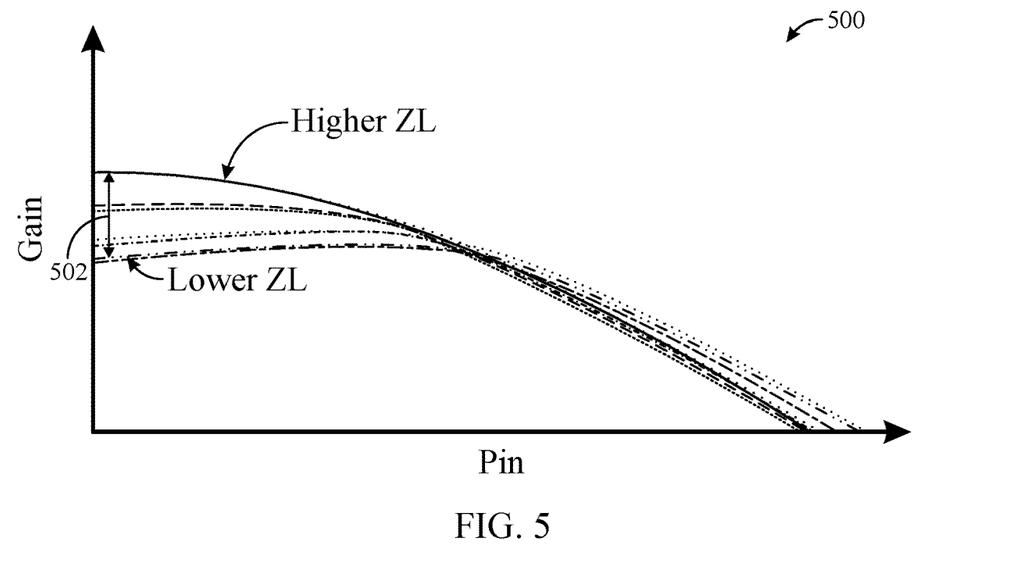
FIG. 5 is a graph illustrating variations in gain associated with a power amplifier (PA) due to changes in load impedance.

FIG. 5 is a graph 500 illustrating variations in gain with input power (Pin) associated with a PA due to changes in load impedance. When the impedance associated with load 430 increases, the gain associated with the PA 316 and the voltage swing at the output of the main PA 316 may increase. As illustrated, there may be a variation 502 (e.g., over 5 dB) in gain due to changes in load impedance. The increased gain of the PA 316 due to higher load impedance may result in the compression region of operation of the PA 316 beginning at a lower input power. Thus, due to variations in the load impedance of the PA 316, the output of the PA 316 may saturate. On the other hand, since the output of the replica PA 390 is coupled to an internal load (e.g., a load internal to the RF device), the output impedance of the replica PA 390 may experience little to no variations. Thus, contrary to PA 316, the replica PA 390 may not experience gain variations due to changes in load impedance. Rather, the load impedance of the replica PA 390 may be set to a nominal load impedance value. The voltage swing at the output of the replica PA 390 may remain unchanged, while the voltage swing at the output of the PA 316 may increase due to increase in the impedance of the load 430. As a result, the LAB circuit 414 may detect a higher voltage difference between the voltage swing at the output of the PA 316 (or a processed version thereof labeled "Vdet_PA") and the voltage swing at the output of the replica PA 390 (or a processed version thereof labeled "Vdet_Repl").

Figure 6:
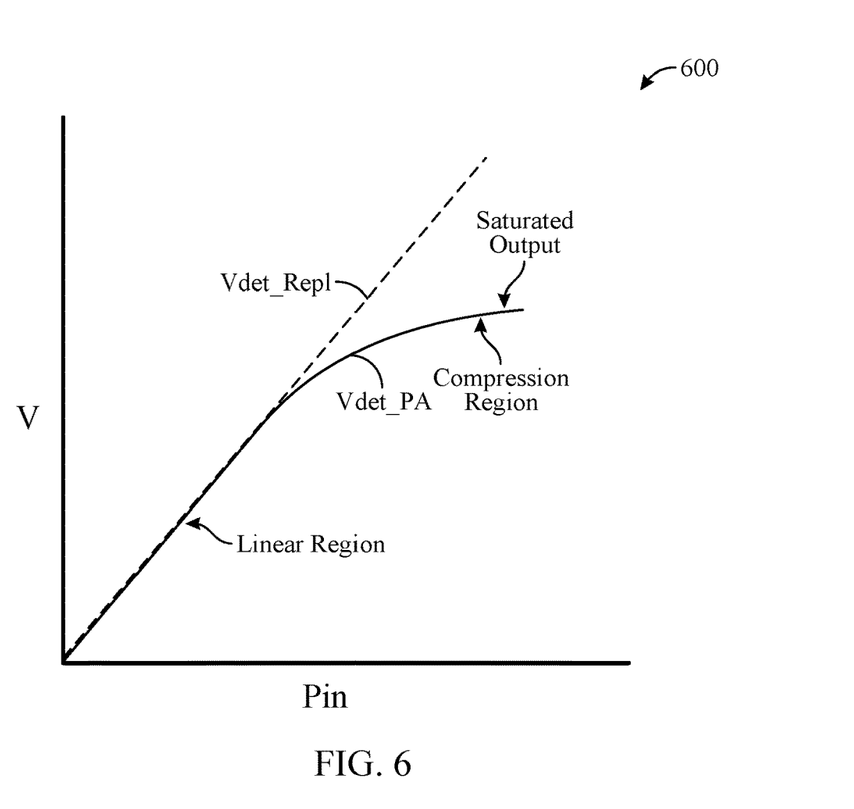
FIG. 6 is a graph illustrating output voltages of a PA and a replica PA, in accordance with certain aspects of the present disclosure.

FIG. 6 is a graph 600 illustrating Vdet_PA and Vdet_Repl, in accordance with certain aspects of the present disclosure. As illustrated, Vdet_PA may begin to saturate as the PA 316 enters a compression region of operation. On the other hand, the replica PA may be more linear and experience compression at a relatively higher input power. Thus, the LAB circuit 414 may detect a voltage swing difference between Vdet_PA and Vdet_Repl.

In response to detecting a higher voltage swing at the output of the PA 316 relative to the voltage swing at the output of the replica PA 390 (e.g., due to the impedance of the load 430 increasing), the LAB circuit 414 decreases the bias voltage of the PA 316, in effect reducing the gain of the PA 316. On the other hand, if the impedance of the load 430 decreases, the voltage swing at the output of the PA 316 decreases relative to the voltage swing at the output of the replica PA 390. In response, the LAB circuit 414 increases the bias voltage of the PA 316, in effect increasing the gain of the PA 316. In this manner, the LAB circuit 414 reduces gain variations of the PA 316 due to variations in impedance of the load 430. The LAB circuit 414 may also reduce variations in the voltage swing at the output of the PA 316 resultant from variations in the impedance of the load 430. That is, the LAB circuit may bias the PA 316 such that a gain (e.g., voltage gain) associated with the PA 316 consistently tracks a gain profile associated with the PA 390. For example, the voltage gain of the PA 316 may be set to track a voltage gain of the PA 390 such that Vdet_PA tracks Vdet_Repl, as described with respect to FIG. 6. By controlling the voltage gain of the PA 316 to follow the voltage gain of a replica PA 390, the compression characteristic of the voltage gain vs. input power curve of PA 316 may exhibit less variation as VSWR changes.

Figure 7:
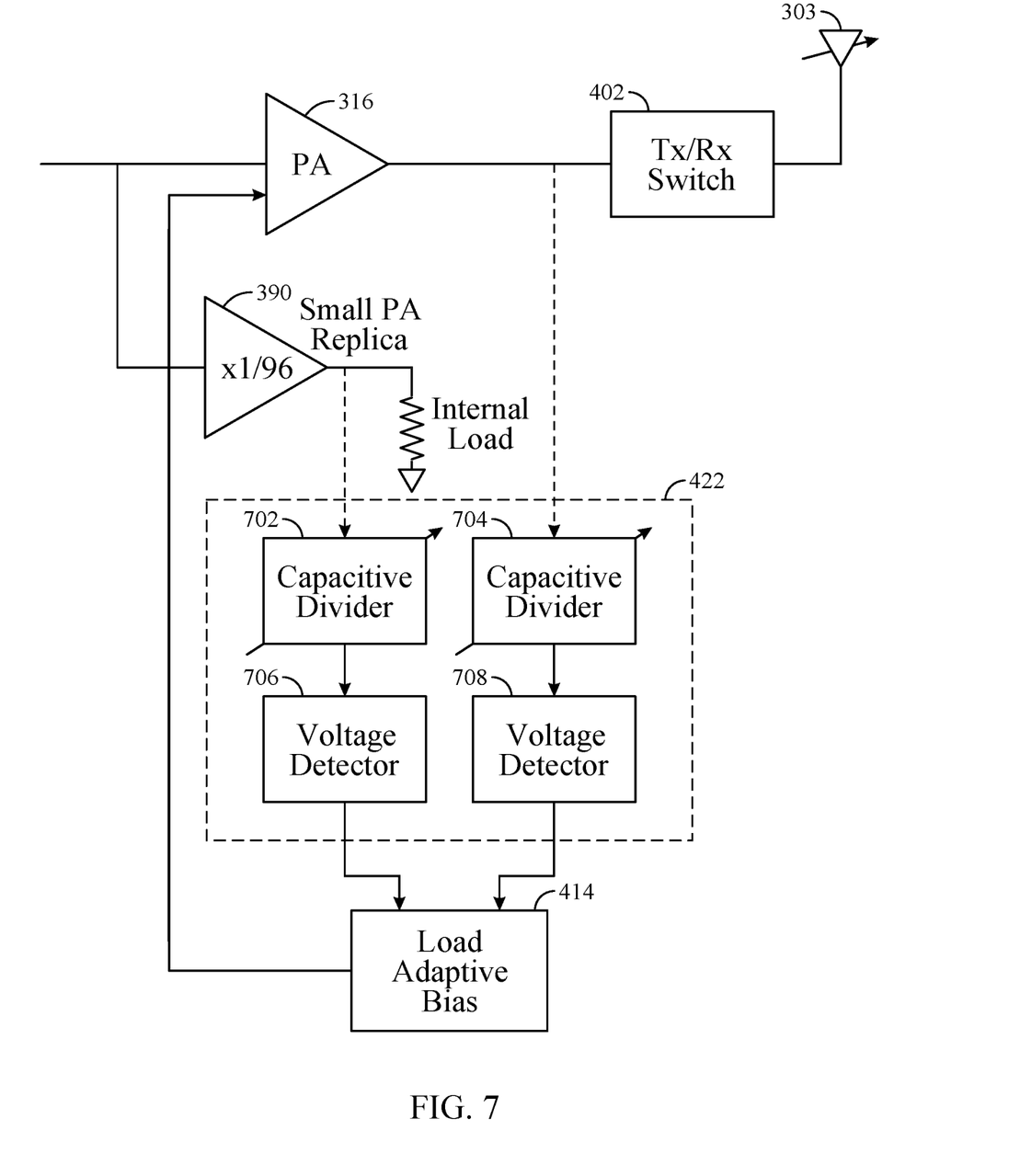
FIG. 7 illustrates an example implementation of a processing circuit, in accordance with certain aspects of the present disclosure.

FIG. 7 illustrates an example implementation of the processing circuit 422, in accordance with certain aspects of the present disclosure. As illustrated, the processing circuit 422 may include capacitive dividers 702, 704 (also referred to as "capacitive voltage dividers") to scale the voltage swing from PA 316 and PA 390 to the same level (e.g., based on calibration at nominal antenna load). Two averaging voltage detectors 706, 708 may be implemented to detect the envelope or peak of voltage swing from PA and replica PA separately. The LAB circuit may then set the gate voltage bias of PA 316 based on the outputs of the averaging voltage detectors 706, 708, as described herein. As the impedance of the load 430 changes, the LAB circuit adjusts the gate bias of PA 316 such that the LAB circuit maintains the gain of PA 316 to be close to the PA gain at a nominal load condition. For example, the variation 502 in the gain of PA 316 may be reduced to about 2 dB in some implementations.

Figure 8:
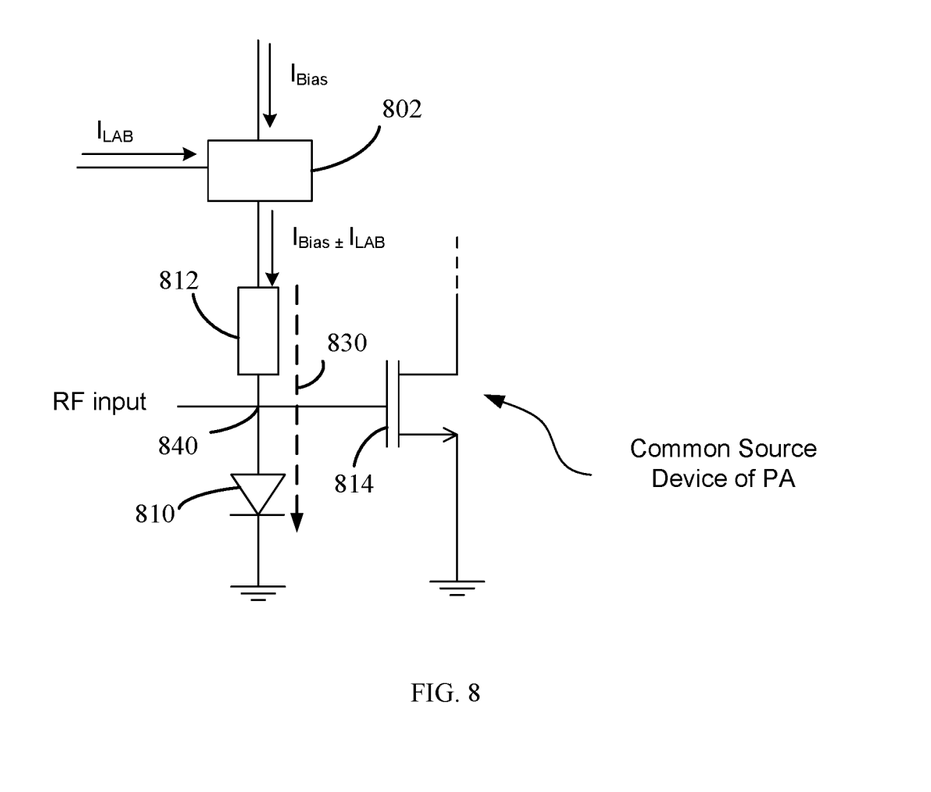
FIG. 8 illustrates a common source device of a PA, in accordance with certain aspects of the present disclosure.

FIG. 8 illustrates a common source device of the PA 316 being biased based on a current ($I_{LAB}$) from the LAB circuit 414, in accordance with certain aspects of the present disclosure. As illustrated, $I_{LAB}$ and a biasing current $I_{Bias}$ may be provided to current summation or subtraction circuit 802. The output of the current summation or subtraction circuit 802 may be equal to the sum of $I_{Bias}$ and $I_{LAB}$ or the difference of $I_{Bias}$ and $I_{LAB}$, as illustrated. The output current of the summation or subtraction circuit 802 may flow across a diode 810 and resistive element 812 of a direct-current (DC) path 830, setting a bias voltage at the gate of transistor 814 (e.g., at node 840) used to implement the common source device.

Using a replica PA allows for adjustment of the gate bias of the PA 316 in order for the PA 316 to track a specified amplitude modulation (AM) to AM curve with predictable gain expansion and compression across process, voltage, and temperature (PVT) variations. Since load variation is relatively slow as compared to the envelop variation at the output of the PA 316, a slow tracking loop may be used to adjust the gain of PA 316. For instance, slow active circuits (e.g., average voltage detectors 706, 708) may be used to save current consumption. Moreover, the average voltage swing at the output of the PA 316 and PA 390 may be used. For example, average voltage detectors 706, 708 may in effect extract the baseband envelope from the output voltages of PAs 316, 390 and filter out the envelope of the voltages at outputs of the PAs 316, 390 which would otherwise interact with the signal at the gate of transistor 814 to create a third-order intermodulation (IM3) signal component at the output of the PA 316.

Figure 9:
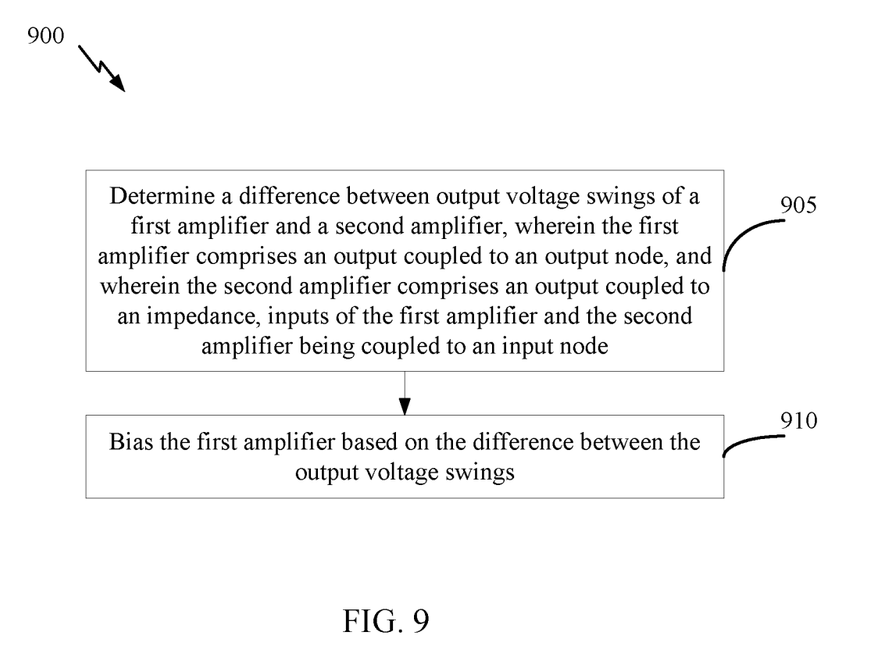
FIG. 9 is a flow diagram depicting example operations for signal amplification, in accordance with certain aspects of the present disclosure.

FIG. 9 is a flow diagram depicting example operations 900 for wireless communication, in accordance with certain aspects of the present disclosure. For example, the operations 900 may be performed by an amplification system, such as the amplification system 400.

The operations 900 begin, at block 905, with the amplification system determining a difference between output voltage swings of a first amplifier (e.g., PA 316) and a second amplifier (e.g., PA 390). The first amplifier may be a power amplifier of a transmit path. In certain aspects, the first amplifier may include an output coupled to an output node (e.g., output node 450). The second amplifier may include an output coupled to an impedance (e.g., load 394), inputs of the first amplifier and the second amplifier being coupled to an input node (e.g., input node 401). At block 910, the amplification system may bias the first amplifier based on the difference between the output voltages. For example, biasing the first amplifier may include decreasing a bias voltage of the first amplifier when output voltage swing of the first amplifier is larger than the output voltage swing of the second amplifier, and increasing the bias voltage when the output voltage swing of the first amplifier is smaller than the output voltage swing of the second amplifier. Biasing the first amplifier may include providing a biasing current (e.g., $I_{LAB}$) to a DC path (e.g., DC path 830) coupled to a gate (e.g., at node 840) of a common source device of the first amplifier. In some aspects, biasing the first amplifier may include biasing a gate of a transistor (e.g., transistor 814) of the first amplifier. The first amplifier may include a common source device implemented using the transistor.

In some aspects, the amplification system may determine a first average voltage swing (e.g., via average voltage detector 706) associated with an output voltage of the first amplifier, and determine a second average voltage swing (e.g., via average voltage detector 708) associated with an output voltage of the second amplifier. In some aspects, the amplification system may generate a first voltage-divided signal (e.g., via capacitive divider 702) by performing a voltage division on the output voltage of the first amplifier, the first average voltage swing being determined based on the first voltage-divided signal. The amplification system may also generate a second voltage-divided signal (e.g., via capacitive divider 704) by performing a voltage division on the output voltage of the second amplifier, the second average voltage swing being determined based on the second voltage-divided signal. The first voltage-divided signal may be referred to as the scaled output voltage swing of the first amplifier and the second voltage-divided signal may be referred to as the scaled output voltage swing of the second amplifier.

In some aspects, biasing the first amplifier may include biasing the first amplifier such that a gain associated with the first amplifier tracks a gain profile associated with the second amplifier. In some aspects, biasing the first amplifier may include biasing the first amplifier such that variations in an output voltage swing of the first amplifier due to changes in a load impedance (e.g., impedance of load 430) coupled to the output of the first amplifier are reduced.

As described herein, the second amplifier may be a replica of the first amplifier. In this case, a size of the second amplifier may be a fraction of a size of the first amplifier.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, means for determining a difference between output voltage swings may include a processing circuit, such as processing circuit 422, and/or a LAB circuit, such as LAB circuit 414. Means for biasing may include a LAB circuit, such as the LAB circuit 414. Means for determining an average voltage may include an average voltage detector, such as the average voltage detector 706 or 708. Means for generating a voltage-divided signal may include a voltage divider, such as the capacitive divider 702 or 704.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An amplification system comprising:
   a first amplifier having an output coupled to an output of the amplification system;
   a second amplifier, inputs of the first amplifier and the second amplifier being coupled to an input of the amplification system;
   an impedance coupled to an output of the second amplifier; and
   a biasing circuit having a first voltage sense input coupled to the output of the first amplifier, a second voltage sense input coupled to the output of the second amplifier, and an output coupled to a bias input of the first amplifier, the biasing circuit comprising a load adaptive bias circuit configured to:
   determine a difference between output voltage swings of the first amplifier and the second amplifier; and
   bias the first amplifier based on the difference, wherein the load adaptive bias circuit is configured to bias the first amplifier by:
   decreasing a bias voltage of the first amplifier when the output voltage swing of the first amplifier is larger than the output voltage swing of the second amplifier; and
   increasing the bias voltage when the output voltage swing of the first amplifier is smaller than the output voltage swing of the second amplifier.

2. The amplification system of claim 1, wherein the load adaptive bias circuit is configured to bias the first amplifier by providing a biasing current to a direct-current (DC) path coupled to a gate of a common source device of the first amplifier.

3. The amplification system of claim 1, wherein the load adaptive bias circuit is configured to bias the first amplifier by biasing a gate of a transistor of the first amplifier.

4. The amplification system of claim 3, wherein the first amplifier comprises a common source device implemented using the transistor.

5. The amplification system of claim 1, wherein the biasing circuit further comprises:
   a first average voltage detector coupled between the first voltage sense input and a first input of the load adaptive bias circuit; and
   a second average voltage detector coupled between the second voltage sense input and a second input of the load adaptive bias circuit.

6. The amplification system of claim 5, wherein the biasing circuit further comprises:
   a first voltage divider circuit having the first voltage sense input coupled to the output of the first amplifier and having an output coupled to an input of the first average voltage detector; and
   a second voltage divider circuit having the second voltage sense input coupled to the output of the second amplifier and having an output coupled to an input of the second average voltage detector.

7. The amplification system of claim 6, wherein the first voltage divider circuit and the second voltage divider circuit comprise capacitive voltage divider circuits.

8. The amplification system of claim 1, wherein the biasing circuit is configured to bias the first amplifier such that a gain associated with the first amplifier tracks a gain profile associated with the second amplifier.

9. The amplification system of claim 1, wherein the biasing circuit is configured to bias the first amplifier such that variations in the output voltage swing of the first amplifier due to changes in a load impedance coupled to the output of the first amplifier are reduced.

10. The amplification system of claim 1, wherein the second amplifier is a replica of the first amplifier.

11. The amplification system of claim 1, wherein a size of the second amplifier is a fraction of a size of the first amplifier.

12. The amplification system of claim 1, wherein the first amplifier comprises a power amplifier of a transmit path.

13. A method for signal amplification, comprising:
determining a difference between output voltage swings of a first amplifier and a second amplifier, wherein the first amplifier comprises an output coupled to an output node and wherein the second amplifier comprises an output coupled to an impedance, inputs of the first amplifier and the second amplifier being coupled to an input node; and
biasing the first amplifier based on the difference between the output voltage swings, wherein biasing the first amplifier comprises:
decreasing a bias voltage of the first amplifier when the output voltage swing of the first amplifier is larger than the output voltage swing of the second amplifier; and
increasing the bias voltage when the output voltage swing of the first amplifier is smaller than the output voltage swing of the second amplifier.

14. The method of claim 13, wherein biasing the first amplifier comprises providing a biasing current to a direct-current (DC) path coupled to a gate of a common source device of the first amplifier.

15. The method of claim 13, wherein biasing the first amplifier comprises biasing a gate of a transistor of the first amplifier.

16. The method of claim 15, wherein the first amplifier comprises a common source device implemented using the transistor.

17. The method of claim 13, further comprising:
determining a first average voltage associated with the output voltage swing of the first amplifier; and
determining a second average voltage associated with the output voltage swing of the second amplifier.

18. The method of claim 17, further comprising:
generating a first voltage-divided signal by performing a voltage division on an output voltage of the first amplifier, the first average voltage being determined based on the first voltage-divided signal; and
generating a second voltage-divided signal by performing another voltage division on an output voltage of the second amplifier, the second average voltage being determined based on the second voltage-divided signal.

19. The method of claim 18, wherein generating the first voltage-divided signal and generating the second voltage-divided signal are performed via capacitive voltage divider circuits.

20. The method of claim 13, wherein biasing the first amplifier comprises biasing the first amplifier such that a gain associated with the first amplifier tracks a gain profile associated with the second amplifier.

21. The method of claim 13, wherein biasing the first amplifier comprises biasing the first amplifier such that variations in the output voltage swing of the first amplifier due to changes in a load impedance coupled to the output of the first amplifier are reduced.

22. The method of claim 13, wherein the second amplifier is a replica of the first amplifier.

23. The method of claim 13, wherein a size of the second amplifier is a fraction of a size of the first amplifier.

24. The method of claim 13, wherein the first amplifier comprises a power amplifier of a transmit path.

25. An apparatus for signal amplification, comprising:
means for determining a difference between output voltage swings of a first amplifier and a second amplifier, wherein the first amplifier comprises an output coupled to an output node and wherein the second amplifier comprises an output coupled to an impedance, inputs of the first amplifier and the second amplifier being coupled to an input node, wherein the means for determining the difference between output voltage swings comprises means for determining a first average voltage associated with the output voltage swing of the first amplifier and means for determining a second average voltage associated with the output voltage swing of the second amplifier; and
means for biasing the first amplifier based on the difference between the output voltage swings.

26. The apparatus of claim 25, further comprising:
means for generating a first voltage-divided signal by performing a voltage division on an output voltage of the first amplifier, wherein the means for determining the first average voltage is configured to determine the first average voltage based on the first voltage-divided signal; and
means for generating a second voltage-divided signal by performing another voltage division on an output voltage of the second amplifier, wherein the means for determining the second average voltage is configured to determine the second average voltage based on the second voltage-divided signal.

27. An amplification system comprising:
a first amplifier having an output coupled to an output of the amplification system;
a second amplifier that is replica of the first amplifier, a size of the second amplifier being smaller than a size of the first amplifier, inputs of the first amplifier and the second amplifier being coupled to an input of the amplification system;
an impedance coupled to an output of the second amplifier; and
a biasing circuit having a first voltage sense input coupled to the output of the first amplifier, a second voltage sense input coupled to the output of the second amplifier, and an output coupled to a bias input of the first amplifier, the biasing circuit comprising:
a first average voltage detector coupled between the first voltage sense input and the output of the biasing circuit; and
a second average voltage detector coupled between the second voltage sense input and the output of the biasing circuit.

28. The amplification system of claim 27, further comprising:
a first voltage divider circuit coupled between the first voltage sense input and the first average voltage detector; and
a second voltage divider circuit coupled between the second voltage sense input and the second average voltage detector.

29. The amplification system of claim 28, wherein the first voltage divider circuit and the second voltage divider circuit comprise capacitive voltage divider circuits.

30. The amplification system of claim 27, wherein the biasing circuit is configured to bias the first amplifier such that variations in an output voltage swing of the first amplifier due to changes in a load impedance coupled to the output of the first amplifier are reduced.

31. The amplification system of claim 27, wherein the impedance is an internal load set to a nominal load impedance value.

32. An amplification system comprising:
- a first amplifier having an output coupled to an output of the amplification system;
- a second amplifier, inputs of the first amplifier and the second amplifier being coupled to an input of the amplification system;
- an impedance coupled to an output of the second amplifier; and
- a biasing circuit having a first voltage sense input coupled to the output of the first amplifier, a second voltage sense input coupled to the output of the second amplifier, and an output coupled to a bias input of the first amplifier, wherein the biasing circuit is configured to bias the first amplifier such that variations in an output voltage swing of the first amplifier due to changes in a load impedance coupled to the output of the first amplifier are reduced.

\* \* \* \* \*